(12) United States Patent
Sinha et al.

(10) Patent No.: US 11,139,004 B2
(45) Date of Patent: Oct. 5, 2021

(54) CHARGE PUMP CIRCUIT AND AUXILIARY POWER SUPPLY

(71) Applicant: TEXAS INSTRUMENTS INCORPORATED, Dallas, TX (US)

(72) Inventors: Rohan Sinha, Karnataka (IN); Rajat Kulshrestha, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/078,430

(22) Filed: Oct. 23, 2020

(65) Prior Publication Data

US 2021/0125644 A1 Apr. 29, 2021

(30) Foreign Application Priority Data

Oct. 25, 2019 (IN) .............................. 201941043435

(51) Int. Cl.
 *H02M 3/07* (2006.01)
 *G11C 5/14* (2006.01)

(52) U.S. Cl.
 CPC ............... *G11C 5/145* (2013.01); *H02M 3/07* (2013.01)

(58) Field of Classification Search
 None
 See application file for complete search history.

(56) References Cited

U.S. PATENT DOCUMENTS

| 5,694,072 | A  | * | 12/1997 | Hsiao   | G05F 3/205 |
|           |    |   |         |         | 327/536    |
| 9,225,237 | B2 | * | 12/2015 | Ferrant | H02M 3/07  |
| 9,438,105 | B2 | * | 9/2016  | Li      | G05F 3/205 |
| 9,502,966 | B2 | * | 11/2016 | Lee     | H02M 3/07  |
| 2020/0287524 | A1 | * | 9/2020 | Fan   | H02M 3/07  |

OTHER PUBLICATIONS

R. Gariboldi, et al.; "A 70 mΩ Intelligent High Side Switch With Full Diagnostics"; UTC from IEEE Xplore; downloaded on Sep. 24, 2020; 4 pp.

Thomas Byunghak Cho, et al.; "A 10 b, 20 Msample/s, 35 mW Pipeline A/D Converter"; IEEE Journal of Solid-State Circuits, vol. 30, No. 3, Mar. 1995; 7 pp.

(Continued)

*Primary Examiner* — Thomas J. Hiltunen
(74) *Attorney, Agent, or Firm* — Michael A. Davis, Jr.; Charles A. Brill; Frank D. Cimino (57) ABSTRACT

A charge pump circuit includes input and output charge pump stages. Each charge pump stage includes a respective voltage input, a respective voltage output, a respective first clock input and a respective second clock input. The voltage input of the input charge pump stage is coupled to a voltage supply terminal. The voltage output of the output charge pump stage is coupled to an output of the charge pump circuit. A clock driver circuit includes a first clock output, a second clock output, a first bias input and a second bias input. The first clock output is coupled to the first clock inputs, and the second clock output is coupled to the second clock inputs. A body bias circuit includes first and second bias outputs. The first bias output is coupled to the first bias input, and the second bias output is coupled to the second bias input.

13 Claims, 10 Drawing Sheets

(56) References Cited

OTHER PUBLICATIONS

Akira Umezawa, et al.; "A 5-V-Only Operation 0.6-μm Flash EEPROM with Row Decoder Scheme in Triple-Well Structure"; IEEE Journal of Solid-State Circuits, vol. 27, No. 11, Nov. 1992; 7 pp.

Xiaoxue Jiang, et al.; "A Low-Voltage Charge Pump with Improved Pumping Efficiency"; 2017 IEEE International Symposium on Circuits and Systems (ISCAS); Sep. 28, 2017.

"Charge Pump Circuits: An Overview on Design Strategies and Topologies"; Article, Digital Object Identifier 10.1109/MCAS.2009.935695; IEEE Circuits and Systems Magazine; Mar. 15, 2010; 15 pp.

Roberto Pelliconi, et al.; "Power Efficient Charge Pump in Deep Submicron Standard CMOS Technology"; IEEE Journal of Solid-State Circuits, vol. 38, No. 6, Jun. 2003; 4 pp.

Michelle S.M. Lim, et al.; "Comparison of Latch-based Charge Pumps using Low Voltage Strategies in Energy Harvesting Applications"; IEEE-ICSE 2016 Proc. 2016, Kuala Lumpur, Malyasia; Sep. 22, 2016; 4 pp.

\* cited by examiner

CHARGE PUMP CIRCUIT AND AUXILIARY POWER SUPPLY

CROSS-REFERENCE TO RELATED APPLICATION

This application claims priority from India Patent Application No. 201941043435, filed Oct. 25, 2019, and entitled A SUB-1V INPUT CHARGE PUMP CIRCUIT WITH PVT AWARE BODY BIAS CLOCK DRIVERS, which is incorporated herein by reference in its entirety.

TECHNICAL FIELD

This description relates to charge pump systems and circuitry.

BACKGROUND

A charge pump is a type of DC-to-DC converter that uses capacitors for charge storage and provides higher voltages from an input supply. For example, a charge pump includes switches and a capacitor network for charge transfer from an input to an output and can be integrated on an integrated circuit (IC). They are conventionally used in non-volatile memories, electrostatic actuators and high voltage switching applications. With threshold voltage of transistors approaching the supply voltage in many applications, lesser overdrive voltage and higher on resistance results in degraded efficiency and reduced charge pump gain. Many charge pump designs may also exhibit higher current load at the output, which further degrades the charge pump efficiency.

SUMMARY

In a described example, a charge pump circuit includes an input charge pump stage and an output charge pump stage. Each charge pump stage includes a respective voltage input, a respective voltage output, a respective first clock input and a respective second clock input. The voltage input of the input charge pump stage is coupled to a voltage supply terminal. The voltage output of the output charge pump stage is coupled to an output of the charge pump circuit. A clock driver circuit includes a first clock output, a second clock output, a first bias input and a second bias input. The first clock output is coupled to the first clock inputs, and the second clock output is coupled to the second clock inputs. A body bias circuit includes first and second bias outputs. The first bias output is coupled to the first bias input, and the second bias output is coupled to the second bias input.

In another described example, a device includes an input charge pump stage, an output charge pump stage, a clock driver circuit and a body bias circuit. The input charge pump stage includes a voltage input and first and second voltage outputs, in which the voltage input is coupled to a voltage supply terminal. The input charge pump stage is configured to supply a first pump voltage to the first voltage output and a second pump voltage to the second voltage output responsive to first and second clock signals. The output charge pump stage includes first and second voltage inputs and a voltage output, in which the first voltage input is coupled to a first voltage output of a preceding charge pump stage, and the second voltage input is coupled to a second voltage output of the preceding charge pump stage. The output charge pump stage is configured to provide an output voltage at the voltage output responsive to the first and second clock signals. The clock driver circuit is configured to provide the first and second clock signals. The body bias circuit configured to supply forward body bias signals to transistors of the clock driver circuit.

As a further described example, a system includes an auxiliary power supply. The auxiliary power supply includes a clock driver circuit, a body bias circuit and a charge pump circuit. The clock driver circuit is configured to provide non-overlapping first and second clock signals. The body bias circuit is configured to supply forward body bias signal to transistors of the clock driver circuit. The charge pump circuit includes charge pump stages connected in parallel. An input charge pump stage is configured to supply a first and second pump voltages based on a voltage at a voltage supply terminal and the first and second clock signals. An output charge pump stage is configured to provide an output voltage at an output of the charge pump circuit based on a voltage of a preceding charge pump stage and the first and second clock signals. A device is coupled to the output of the charge pump circuit.

DETAILED DESCRIPTION

Example embodiments relate to charge pump systems and circuitry, such as to provide an auxiliary power supply for low voltage operation. For example, the charge pump includes charge pump stages connected in parallel between an input and an output. A charge transfer switch (e.g., an n-type field effect transistor (NFET)) is coupled between adjacent pump stages. The charge transfer switch is designed to achieve improved charge transfer efficiency by reducing or eliminating leakage current. A clock driver circuit is coupled to clock inputs of the charge pump stages. For example, the clock driver circuit is configured to provide non-overlapping clock signals to implement respective control cycles to increase the voltage at the output. A body bias circuit is coupled to the clock driver circuit. For example, the body bias circuit is configured to apply bias signals to transistors of the clock driver circuit. As a result, the bias circuit helps to reduce the threshold voltage and the size of the devices in the clock driver circuit at low supply voltages, while also reducing leakage current flowing to the substrate. Thus, driving strength and efficiency of the charge pump can be improved at low supply voltages (e.g., less than about 1 V).

In an example, a respective parallel branch generates a gate-boosted signal that is applied to control the charge transfer switches (CTSs) of the respective parallel branch, which does not experience any current load. As a result, the VGS in the charge transfer switches increases as the output current load increases. This leads to lower conduction loss and results in better charge transfer efficiency, including for high current load applications. In some examples, the charge pump thus may be implemented as an auxiliary power supply configured to provide a supply voltage for a variety of devices during startup, such as to supply a voltage to facilitate boot loading of memory devices.

Figure 1:
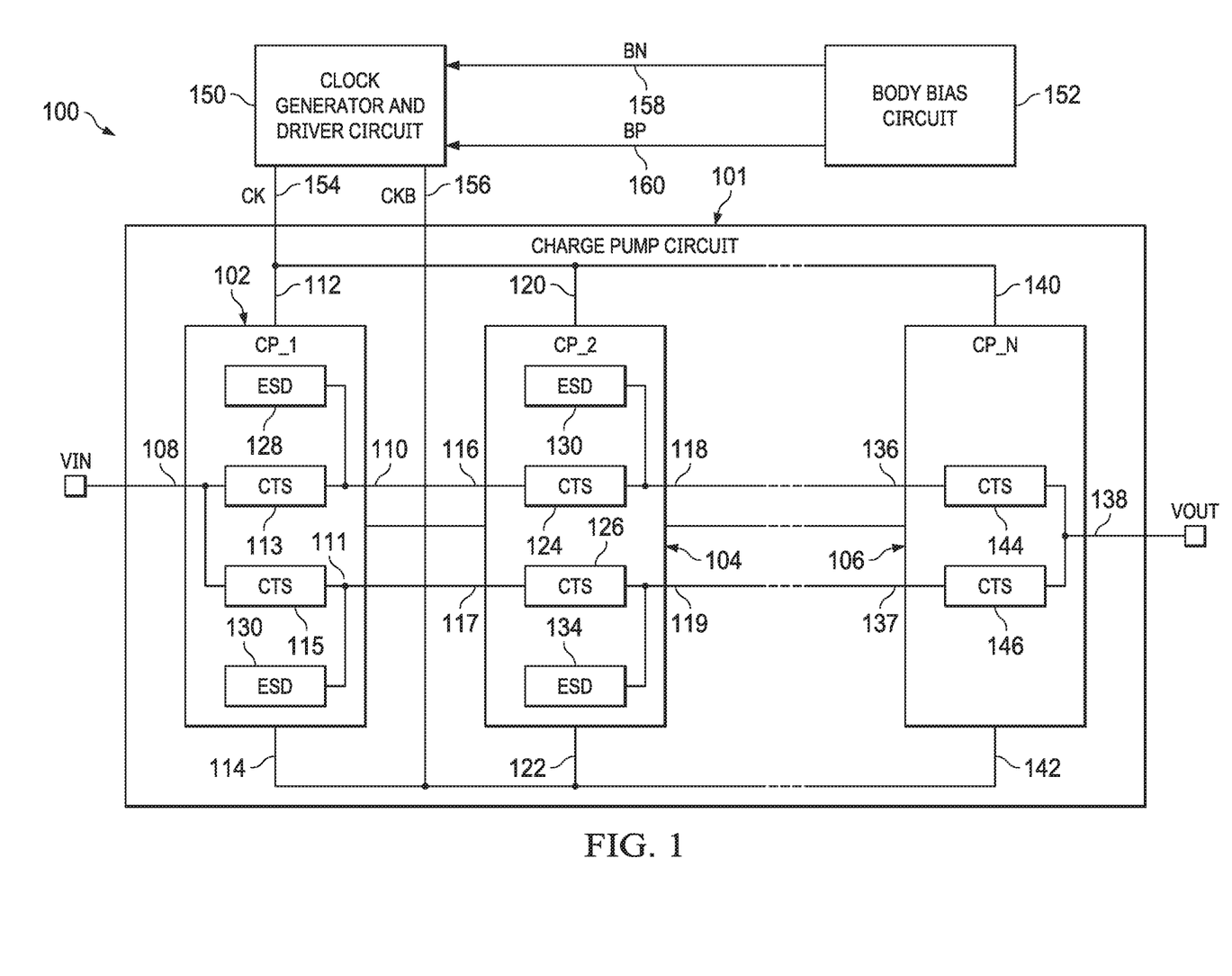
FIG. 1 is a block diagram of an example charge pump system.

FIG. 1 is a block diagram of an example charge pump system 100. The system 100 includes a charge pump circuit 101 having charge pump stages 102, 104 and 106 connected in parallel, shown as CP_1, CP_2 and CP_N, where N is a positive integer greater than or equal to two and denotes the number of charge pump stages. The input charge pump stage 102 has a voltage input 108, voltage outputs 110 and 111, a first clock input 112 and a second clock input 114. The voltage input 108 is adapted to be coupled to a voltage source, such as a voltage supply terminal (e.g., voltage supply rail) having an input voltage VIN (e.g., equal to VDD of an integrated circuit on which the system 100 is implemented). For example, a voltage regulator of the IC is configured to provide the input voltage VIN as a regulated DC voltage. The input stage 102 also includes charge transfer switches 113 and 114 coupled between the input 110 and respective outputs 110 and 111. The voltage output 110 is coupled to a voltage input 116 of the next charge pump stage 104, and the voltage output 111 is coupled to another voltage input 117 of the next stage 104. The first stage also includes energy storage devices (e.g., capacitor networks) 128 and 130 coupled to outputs 110 and 111, respectively. The energy storage devices 128 and 130 store energy responsive to activation of the charge transfer switches 113 and 114, so the stored energy is available for use by the next stage 104.

The charge pump stage 104 is similarly configured to the first charge pump stage 102. The charge pump stage 104 has voltage inputs 116 and 117, voltage outputs 118 and 119, a first clock input 120 and a second clock input 122. The charge pump stage 104 also includes charge transfer switches 124 and 126. The charge transfer switch 124 is coupled between energy storage devices (e.g., capacitor networks) 128 and 130 of the first and second charge pump stages 102 and 104, respectively. The charge transfer switch 126 is coupled between an energy storage device 132 of the charge pump stage 102 and an energy storage device 134 of the charge pump stage 104. Any subsequent intermediate charge pump stages between the charge pump stages 104 and 106 (indicated by ellipses) may be configured the same as stage 104.

The output charge pump stage 106 has voltage inputs 136 and 137, a voltage output 138, a first clock input 140 and a second clock input 142. The voltage inputs 136 and 137 are coupled to respective voltage outputs of a preceding charge pump stage (i.e., stage N-1). The voltage output 138 provides an output voltage VOUT at a terminal, which is adapted to be coupled to a device requiring a supply voltage that exceeds the input voltage VIN for at least a duration (e.g., during a startup time interval). Higher output voltages can be obtained by cascading a greater number of intermediate stages between the input and output stages 102 and 106.

The output charge pump stage 106 also includes charge transfer switches 144 and 146. The charge transfer switch 144 is coupled between the voltage output 138 and a preceding energy storage device (e.g., ESD 130 for a three stage charge pump). The charge transfer switch 146 is coupled between the voltage output 138 and another energy storage device of the preceding stage (e.g., ESD 134 for a three stage charge pump).

The system 100 also includes a clock generator and driver circuit 150 and a body bias circuit 152. The clock generator and driver circuit 150 includes clock outputs 154 and 156. The clock generator is configured to provide non-overlapping clock signals CK and CKB. The clock output 154 is coupled to the clock inputs 112, 120 and 140 of the respective charge pump stages 102, 104 and 106. The clock output 156 is coupled the other clock inputs 114, 122 and 142 of the respective charge pump stages 102, 104 and 106. For example, the clock signals CK and CKB drive energy storage devices of the respective pump stages 102, 104 and 106 to cycle charge pumping operations to increase the voltage VOUT at the output 138 accordingly.

In an example, each charge transfer switch comprises a respective NFET. Also, the charge pump stages 102, 104 and 106 is further configured to implement a gate boosting protocol that controls the respective charge transfer switches to lower the conduction resistance of the charge transfer switches based on an increase in the output load current. For example, the conduction resistance of the charge transfer switches may be decreased proportionally with an increase in output load current. This is because charge pump stages 102, 104 and 106 do not experience load current.

The body bias circuit 152 has first and second bias outputs 158 and 160. The first bias output 158 is coupled to a first bias input of the driver circuit 150, and the second bias output 160 is coupled to a second bias input. The body bias circuit 152 is configured to generate bias signals BN and BP at the respective bias outputs 158 and 160 for biasing NFETs and p-type field effect transistors (PFETs) in the driver circuit 150. The body biasing circuit is further configured to adapt the bias signals BN and BP to automatically track changes in the threshold voltage (Vth) of the transistors in the clock driver circuit 150 with respect to process and temperature variations. The bias circuit thus helps in reducing the threshold voltage and the size of the devices in the clock driver at low supply voltages, without having any leakage current flowing to the substrate.

As a result, the system 100 operates more efficiently at low supply voltages (e.g., at supply voltages approximating Vth) than many existing charge pump designs. For example, the approach described herein may exhibit power efficiency 1.5 to 2 times greater than existing charge pump architectures for similar conditions of output load current, number of charge pump stages and input voltages.

Figure 2:
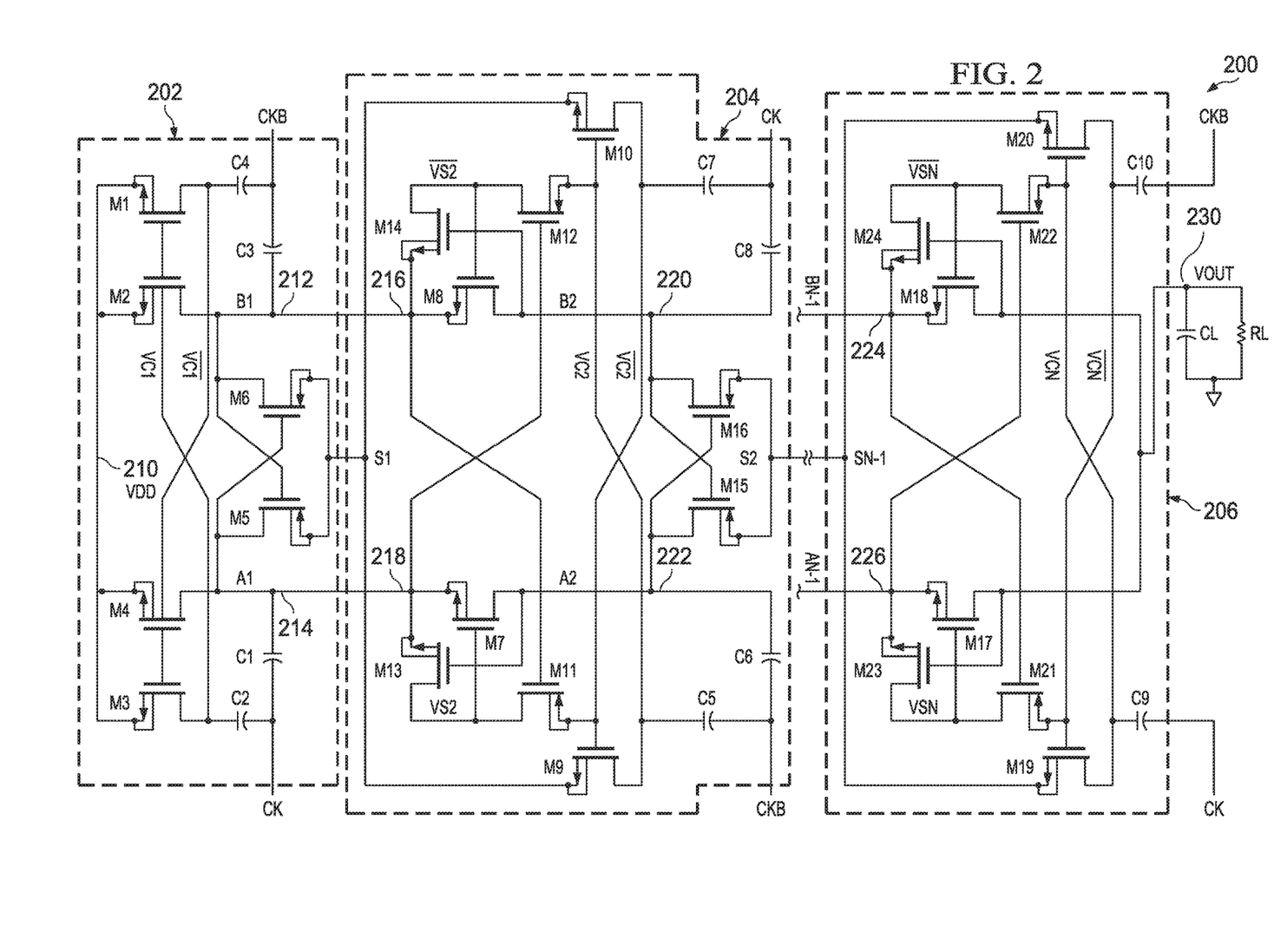
FIG. 2 depicts an example charge pump circuit.

FIG. 2 depicts an example charge pump circuit 200. The charge pump circuit 200 is useful to implement the charge pump circuit 101 of FIG. 1. The charge pump circuit 200 includes charge pump stages 202, 204 and 206 (e.g., a version of stages 102, 104 and 106). In the example of FIG. 2, the charge pump stages are configured to perform alternating pumping operations responsive to clock drive signals CK and CKB. For example, the clock drive signals CK and CKB are generated by clock generator and driver circuit 150 of FIG. 1 or circuitry 600 of FIG. 6.

The input stage 202 includes a voltage input 210 configured to receive a supply voltage, indicated at VDD. The input stage 202 also has outputs 212 and 214 that are coupled to respective inputs 216 and 218 of the subsequent stage 204. The signal at the output 212 is shown at B1, and the signal at 214 is shown at A1. The charge pump 204 also includes respective outputs 220 and 222, shown at B2 and A2, respectively. The output stage 206 of the circuit 200 includes inputs 224 and 226, shown at BN-1 and AN-1, where N is a positive integer denoting the number of charge pump stages in the circuit 200. The output stage 206 also includes an output 230 at which the output voltage VOUT is provided responsive to the input voltage VDD at the input 210.

The stages 202, 204 and 206 are configured to perform alternating pumping phases by respectively charging and discharging energy storage networks (e.g., capacitive networks), responsive to the clock driver signals CK and CKB at respective clock inputs of the stages. In this example, the charge pump circuit 200 is a two-phase circuit that receives non-overlapping clock driver signals CK and CKB. In other examples, a different number of clock signals could be provided for running a different number of phases of charge pumping.

In the first stage 202, the non-overlapping clock signals are provided to respective inputs to drive capacitor networks responsive to the CK and CKB signals. In the example of FIG. 2, one capacitor network includes capacitors C1 and C2 having a clock input configured to receive the CK signal. Another capacitor network includes capacitors C3 and C4 having a clock input configured to receive CKB. The first stage 202 also includes cross-coupled NFETs M1 and M2, which are connected in parallel with another pair of cross-coupled NFETs M3 and M4.

For example, when CK is high, the voltage applied to capacitor C2 drives the drain of M3 (shown as node VC1) to twice the voltage VDD at the input 210 (i.e., 2VDD). Conversely, when CKB is high and CK is low, capacitor C4 drives the drain of M1 (shown as node VC1!) with 2VDD. A cross-coupled pair of PFETs M5 and M6 is coupled between respective outputs 212 and 214, shown respectively as B1 and A1. The output of the cross-coupled pair M5, M6 is shown at S1. The cross-coupled pair of PFETs M5 and M6 is configured to pass the higher voltage among A1 and B1 to the output S1, which is passed to the next stage 204.

The second stage 204 includes charge transfer switches (e.g., versions of CTS 124, 134) configured to transfer charge from a preceding charge pump stage 202 to a next charge pump stage. In the example of FIG. 2, the charge transfer switches are shown as NFETs M7 and M8, respectively. M7 is coupled between the input 216 and output 220, and M8 is coupled between the input 218 and output 222.

The second stage 204 also includes a first capacitor network of capacitors C5 and C6, in which C5 is coupled between the clock input, which receives clock driver signal CKB and the drain of an NFET M9. C6 is coupled between the clock input CKB and the output 222 (shown as node A2). Another capacitive network includes capacitors C7 and C8. The capacitor C7 is coupled between the other clock input, which receives clock driver signals CK, and a drain of a transistor M10. The drain of transistor M10 is also coupled to the gate of transistor M9, and the drain of transistor M9 is coupled to the gate of transistor M10. The capacitor C8 is coupled between the clock input and the output of the second stage 220 (shown as node B2).

For example, the transistor M9 and capacitor C5 are configured to discharge the voltage at the drain of M9, represented at VC2, to approximately 2VDD in response to the CK signal being high and the CKB signal being low. Similarly, responsive to the capacitor C7 being driven by the CK signal, the gate of M9 (represented at VC2!) is pushed to approximately 3VDD.

A PFET M11 has a gate coupled to the input 216 of the second stage 204 and a source coupled to the gate of M9 (VC2!). The drain of M11 (shown as voltage VS2) is coupled to the gate of charge transfer switch M7. Another NFET M13 has a source coupled to the input 218 and a drain coupled to the drain of M11 (shown as voltage VS2). The gate of M13 is coupled to the output 222 (shown as A2). Similarly, NFET M14 has a source coupled to the input 216 and drain coupled to the drain of PFET M12, and the gate of 214 is coupled to the output 220.

For example, responsive to the CK signal being high (and CKB being low), PFET M11 experiences a voltage from its source the gate (VSG) of approximately 2VDD, which turns on M11. With M11 turned on, the gate of M7 VS2 has a gate-boosted voltage of approximately 3VDD through VC2!. This causes the charge transfer switch M7 to turn on and thereby enable charge transfer from A1 to A2, and which causes transistor M13 to turn off when M7 is turned on. When the CK drive signal is low and CKB is high, PFET M11 turns off, and the voltage at the input 218 is VDD, and the voltage at A2 settles to approximately 3VDD. In response to A2 being approximately 3VDD, the transistor M13 is turned on, and the gate of M7 (VS2) is coupled to A1 and thus discharges to VDD. Also, CKB charges C5 to drive VC2 to 3VDD, which turns on M10. The PFET M12 is also turned on to drive the gate of charge transfer switch NFET M8 (shown as voltage VS2!) to a gate-boosted voltage of 3VDD, which turns on M8 to perform charge transfer from B1 to B2.

The stage 204 also includes cross-coupled PFETs M15 and M16 coupled between the respective second stage outputs 220 and 222. Specifically, the gate of M16 and the drain of M15 are coupled to output 222, and the gate of M15 and drain of M16 are coupled to output 220. The sources of both M15 and M16 are coupled to an output designated at S2, which is coupled a voltage input of the next stage of the circuit 200. The cross-coupled pair M15 and M16 thus are configured to deliver whichever voltage among nodes A2 and B2 is higher to output S2. As a result, a substantially fixed voltage is provided at S2, which in this example is approximately 3VDD. Thus, in the example charge pump circuit 220, each subsequent stage passes a respective higher voltage as an input voltage for driving the subsequent stage.

The output (or Nth) stage 206 of the charge pump circuit 200 is similarly configured to the intermediate stage(s); but it does not include flying capacitors, such as capacitors C6 and C8. Instead, the output stage 206 includes capacitor C9 coupled between the clock input that receives CK and a drain of NFET M19, which is also coupled to the gate of NFET M20 (shown as voltage VCN). The other portion of the output stage includes capacitor C10 coupled between the clock input that receives CKB and the gate of transistor M19, which is also coupled to the drain of transistor M20 (shown as voltage to VCN!). The sources of M19 and M20 are coupled together to receive a voltage input from a preceding stage, shown at SN-1. In a three-stage example, SN-1 is S2 of the second stage 204.

The output stage 206 also includes charge transfer switches shown as NFETs M17 and M18 (e.g., versions of CTS 144, 146 in FIG. 1). M17 is coupled between the input 226 and the output 230. Similarly, transistor M18 is coupled between the other voltage input 224 and the output 230. PFET M21 has a gate coupled to the input 224 and a source coupled to the gate of M19 (to receive the voltage VCN!). The gate of M17 (shown as voltage VSN) is coupled to the drain of PFET M21 and the drain of NFET M23. The gate of M23 is coupled to the output at 230, and the source of M23 is coupled to the input 226.

The gate drive circuit for the other phase portion of the output stage 206 is similarly configured and includes PFET M22 whose gate is coupled to the input 226 and whose source is coupled to the gate of M20 (shown as voltage VCN). The drain of M22 (shown as voltage VSN!) is coupled to the gate of M18 and to the drain of NFET M24. The gate of M24 is coupled to the output 230, and the source of M24 is coupled to the input 224.

For example, responsive to the CK signal going high and the CKB signal going low, the transistor M18 is turned on to transfer charge from the input 224 to an output load capacitor CL. CL is coupled between the output 230 and an electrical ground terminal. A load, shown at RL, can be connected in parallel with CL between the output 230 and the ground terminal. Similarly, responsive to the CKB signal going high and the CK signal going low, the NFET M17 is turned on to transfer charge from the input 226 to the output capacitor CL. In this way, charge is delivered to the output 230 twice every clock signal.

Figure 3:
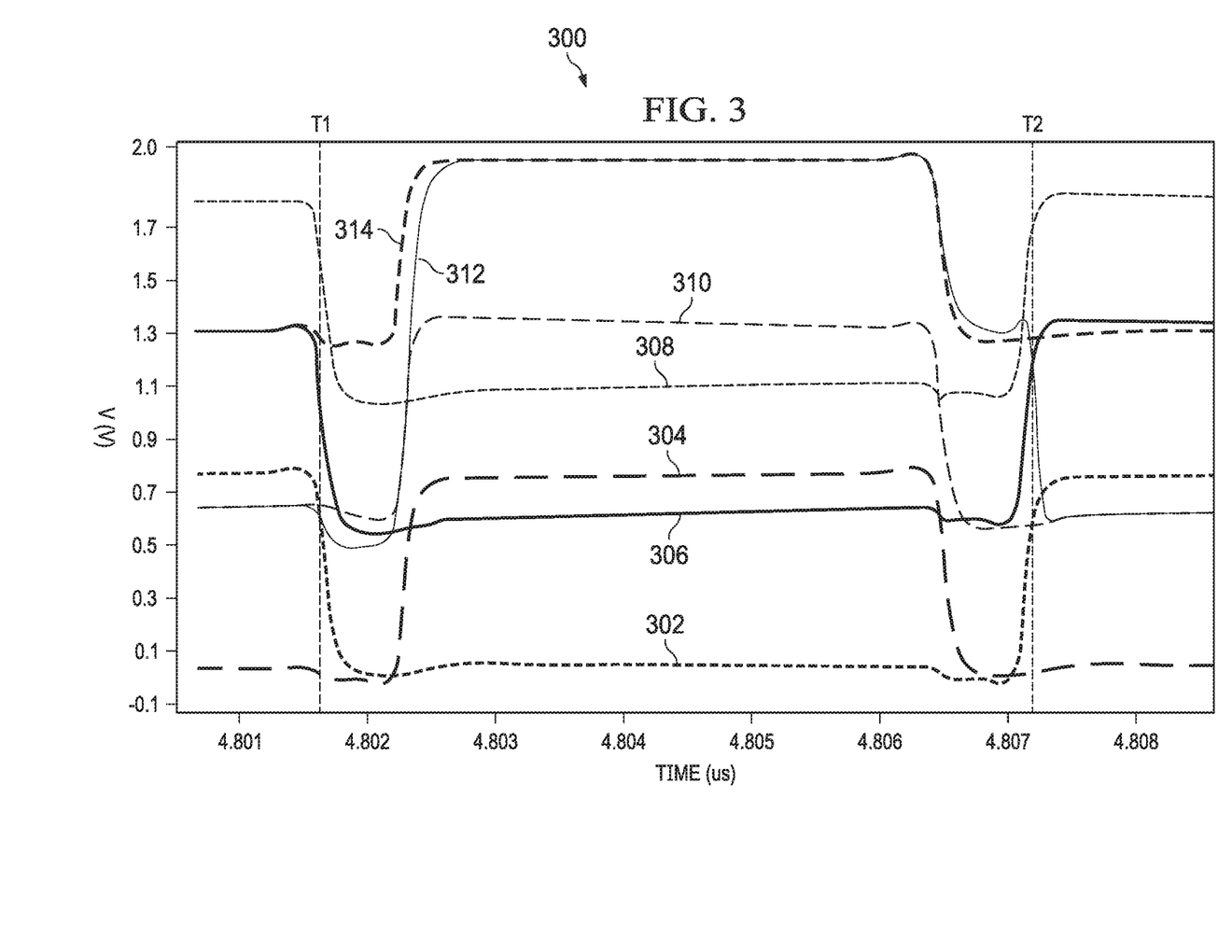
FIG. 3 is a graph of signals at various locations in the circuit of FIG. 2.

FIG. 3 depicts an example signal diagram 300 for various signals 302, 304, 306, 308, 310, 312 and 314 in the circuit 200 to show the switching behavior of the circuit. The example of FIG. 3 shows such signals for an operating condition where VDD equals approximately 0.8 volts and the output current equals approximately 300 micro amps. Thus, the following description of FIG. 3 also refers to FIG. 2.

As illustrated in FIG. 3, the clock signal 302 goes from high to low at time T1 and goes from low to high at time T2. The voltage at the output of 212 of the first stage (shown as node B1), shown at 306, tracks the clock signal CK 302. The voltage at the output 222 (shown as node to A2) of the second stage, as shown at 308, also tracks the clock signal CK 302. In contrast, the opposite phase output signal at 214 (shown as node A1) shown at 310, the voltage at the gate of M7 (shown as voltage VS2) shown at 312, and the voltage at the gate of M9 (shown as voltage VC2!) all track the CKB clock signal 304. Thus, as shown in FIG. 3, the non-overlapping clock signals 302 and 304 are used to control the pumping phases of the charge pump circuit 200 to generate the increased voltage at the output 230. As described above, the voltage at the output 230 may be set on the number of stages implemented in the charge pump circuit 200.

Figure 4:
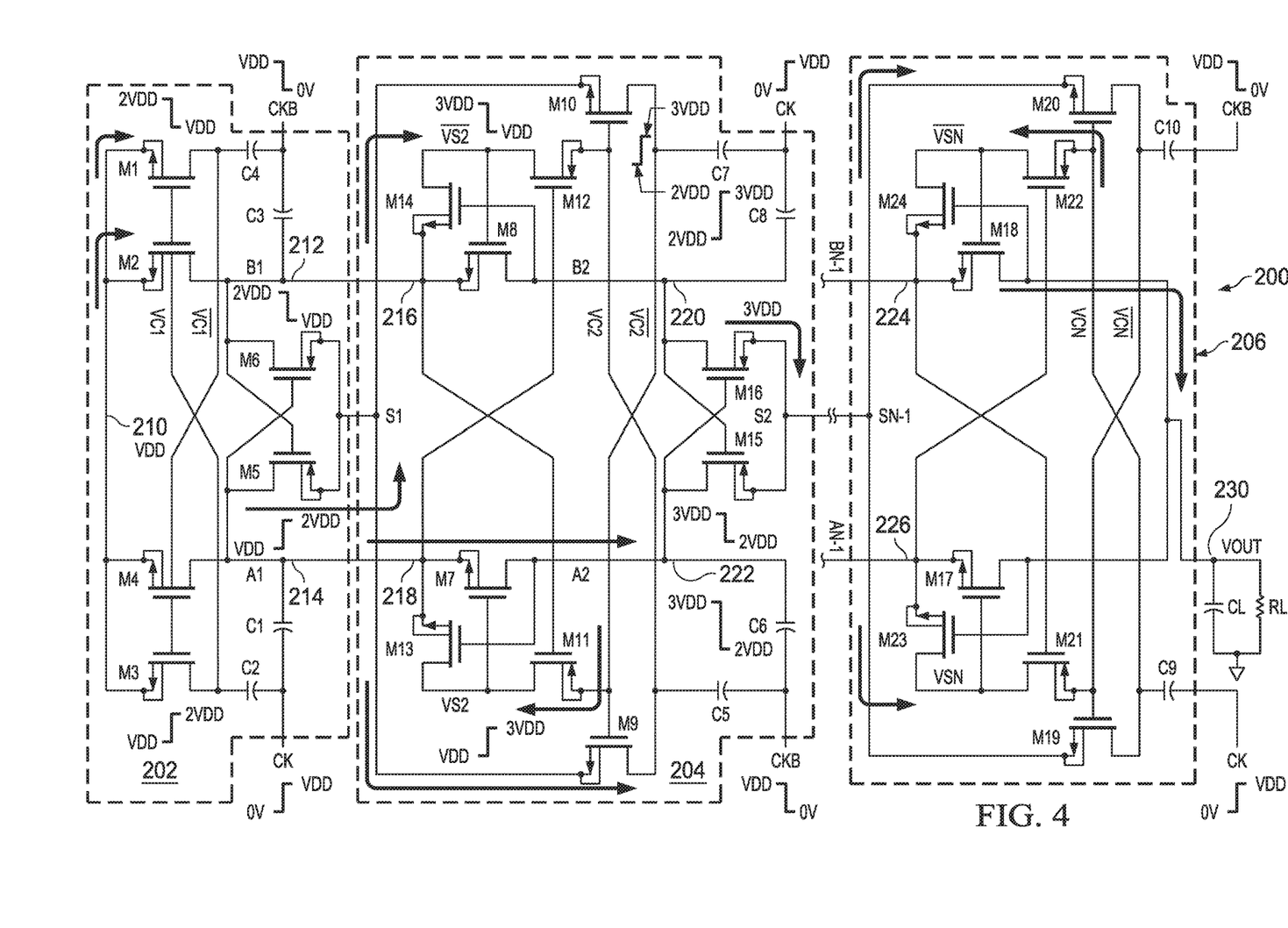
FIG. 4 depicts the charge pump circuit of FIG. 2, showing an example signal flow for a first part of a cycle.
Figure 5:
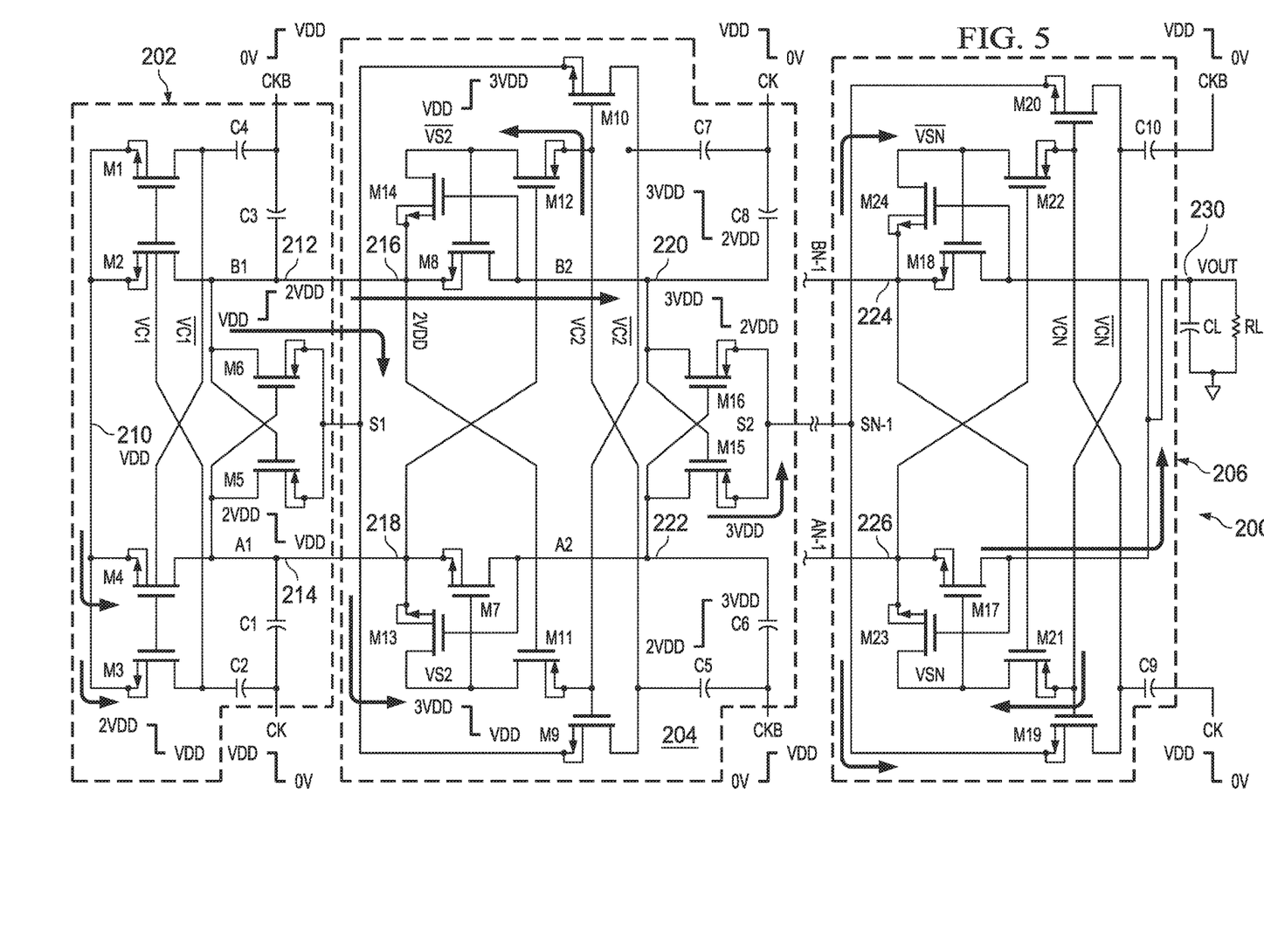
FIG. 5 depicts the charge pump circuit of FIG. 2, showing an example signal flow for a second part of a cycle.

As a further example, FIGS. 4 and 5 show signal flow in the charge pump circuit 200 of FIG. 2 during different phases of the pumping cycle based on the CK and CKB clock signals. In FIGS. 4 and 5, arrows show which transistors (e.g., operating as switch devices) are turned on. Also, the same reference numbers in FIGS. 4 and 5 refer to the same parts and signals described with respect to FIG. 2.

FIG. 4 illustrates the circuit 200 for an interval when the CK driver signal is high (e.g., at VDD) and the CKB clock signal is low (e.g., at 0 V). Under such operating conditions, the voltage at VC1 (which is applied to the gates of M1 and M2) is driven from VDD to 2VDD, thereby turning on M1 and M2. This results in the voltage VC1! and the voltage at the output 212 of the first stage decreasing from 2VDD to VDD. Consequently, M3 and M4 are turned off, and the voltage at the output at 214 (shown as node A1) increases from VDD to 2VDD. Responsive to A1 increasing to 2VDD and the gate of M5 (shown as node B1) decreasing to VDD, the PFET M5 is activated to pass 2VDD from A1 to the output S1.

In the second stage 204, responsive to the CK signal going to VDD, the voltage at the gate of M9 (shown as voltage VC2!) increases from 2VDD to 3VDD, which turns on M9. When MN9 is turned on, the voltage at VC2 decreases from 3VDD to 2VDD to turn off M10. The source-to-gate voltage across PFET M11 turns on M11, which couples the gate of M7 (shown as voltage VS2) to VC2!, which is 3VDD. In response to the gate of M7 being 3VDD, M7 is turned on to transfer the voltage (2VDD) from the voltage input 218 to the output 222, which is coupled to drain of M15.

Also, responsive to the voltage at 220 increasing to 3VDD, the transistor M14 is turned on to pull the gate of charge transfer switch M8 to VDD at the input 216, and M8 is turned off. With M8 turned off, the voltage at the output 220 (V2) is increased from 2VDD to 3VDD and is supplied as an input to cross-coupled pair M15 and M16. Responsive to the voltage at output 220 being greater than the voltage at output 222, M16 is turned on to couple S2 with the output 220, and to provide 3VDD at S2 as an input voltage to the next stage of the circuit 200.

In the output stage 206, in response to CK going high (e.g., from 0 V to VDD) and CKB going low (e.g., from VDD to 0 V), M23 is turned on to supply the voltage from a voltage input 226 to the gate of M17. Also, PFET M22 is turned on responsive to the CK signal going high, which results in the gate of charge transfer switch M18 being coupled to VCN and M18 being turned on. When M18 is on, the voltage input 224 is coupled to the voltage output 230 to transfer the input voltage at 224 to the output 230.

FIG. 5 depicts signal flow in the charge pump 200 for the phase in which the CK signal goes low (e.g., from VDD to 0 V) and the CKB signal goes high (e.g., from 0 V to VDD). A comparison between FIGS. 4 and 5 shows how different parts of the respective stages operate during the different phases of the clock signals. As shown in FIG. 5, the gates of M3 and M4 are driven high in response to CKB going high through drive capacitor C4. Also, M1 and M2 are turned off in response to VC1 going from 2VDD to VDD. As a result, the voltage at the output 212 (shown as node B1) increases from VDD to 2VDD, and the voltage at the output 214 decreases from 2VDD to VDD. Cross-coupled PFETs M5 and M6 pass the voltage from B1, which is greater than the voltage at A1, through M6 to the output S1.

In response to the CK signals decreasing from VDD to 0 V, the voltage at VC2! goes to 2VDD, while the voltage at VC2 increases from 2VDD to 3VDD. Thus, M10 is turned on, and the PFET M12 is turned on, which couples the voltage at VC2 to the gate of charge transfer switch M8 to turn on M8. While M8 is on, M8 transfers the voltage from the input 216 to the second stage output 220, which decreases the voltage at 220 from 3VDD to 2VDD. In contrast, PFET M11 is turned off due to activation of M8, so: the gate-to-source voltage of M13 is above its threshold; and M13 turns on to couple the gate of M7 to the input 218 (shown as node A1), so M7 is turned off. When M7 is turned off, the voltage at 222 (shown as node A2) is 3VDD.

Because the voltage at output 222 is greater than the voltage at output 220, the PFET M15 is turned on (and PFET M16 is off) to transfer 3VDD from the output 222 to the output S2.

In the output stage 206, in response to the CK signal going low (e.g., from VDD to 0 V) and CKB going high (e.g., from 0 V to VDD), the voltage at the source of PFET M21 (shown as voltage VCN!) exceeds the gate voltage at the input 224 by more than the threshold voltage, so the PFET M21 is turned on. In response to M21 being on, the gate of charge transfer NFET M17 (shown as voltage VSN) is coupled to the gate of M19 (shown as voltage VCN!) to turn on M17. When M17 is on, the voltage input 226 is coupled to the voltage output 230 to transfer voltage from input 226 to the output capacitor CL. The other charge transfer switch M18 is turned off in response to M24 being turned on based on the voltage VOUT at 230.

Figure 6:
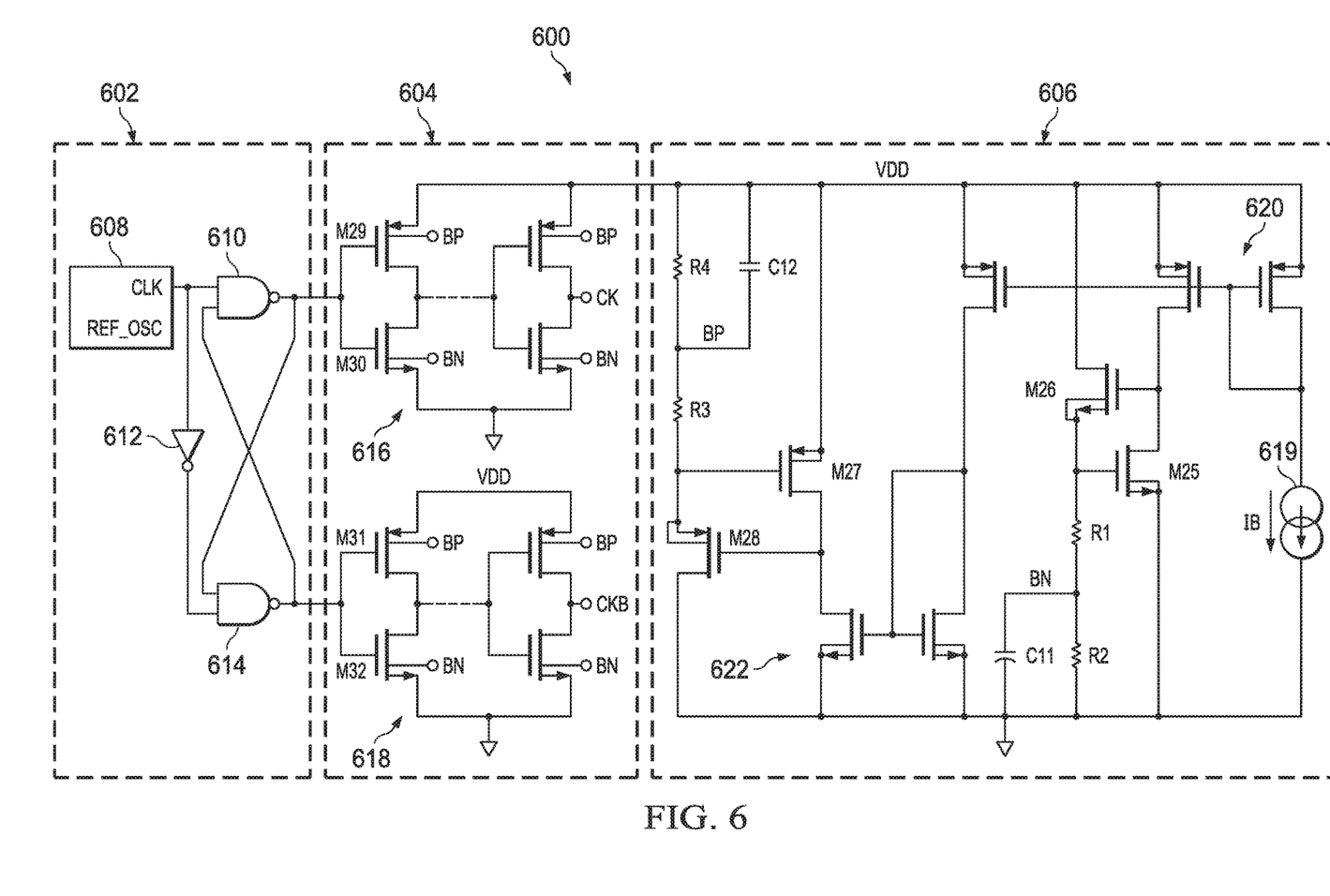
FIG. 6 depicts an example clock driver and body bias circuitry.

FIG. 6 depicts an example clock generator 602, clock driver circuit 604 and a body bias circuit 606. The clock generator 602 and driver circuit 604 are examples of circuitry useful to implement clock generator and driver circuit 150 of FIG. 1. The driver circuit 604 is configured to provide CK and CKB clock driver signals that drive the charge pump circuit (e.g., charge pump circuit 101 or charge pump circuit 200). Body bias circuit 606 is an example circuit useful to implement body bias circuit 152, such as to implement forward body biasing of the clock driver circuit 604.

In the example of FIG. 6, the clock generator 602 includes an oscillator 608. The oscillator 608 has an output coupled to an input of logic circuitry. For example, the logic circuitry includes an NAND gate 610, an inverter 612 and another NAND gate 614. The inverter 612 is coupled between the output of the oscillator 608 and an input of the NAND gate 614. The oscillator is configured to provide a first clock signal at its output CLK. For example, the clock signal is a 50% duty cycle signal having a fixed frequency that may be set according to application requirements. The inverter 612 is configured to invert the clock signal and provide the inverted signal to the input of the NAND gate 614. The outputs of NAND gates 610 and 614 are fed back to the other input of the respective NAND gates, so the output of the NAND gate 614 is not overlapping with the output of the NAND gate 610. Respective outputs of the clock generator 602 are coupled to inputs of the clock driver circuit 604.

The clock driver circuit 604 includes a first driver 616 and a second driver 618. In the example of FIG. 6, the first driver 616 is configured to generate the CK drive signal, and the second driver circuit 618 is configured to generate the CKB driver signal. The body bias circuit 606 is configured to generate NFET and PFET bias signals, indicated at BN and BP. For example, the NFETs of the first and second drivers 616 and 618 have respective bias inputs coupled to the bias output BN. Also, PFETs of the first and second drivers 616 and 618 have respective bias inputs coupled to the bias output BP. Accordingly, the BN and BP signals forward bias transistors in the drivers 616 and 618. By generating the bias signals BN and BP, the body bias circuit 606 helps to reduce the threshold voltage and enables smaller sized transistors in the driver circuit 604, without having leakage current flowing to the substrate. This further enhances the drive strength at or near threshold supply voltage levels. As a result, transistors having normal threshold voltages (e.g., 0.4V to 0.8V) with forward body biasing by the BN and BP signals are useful in the driver circuits. This contrasts with low threshold voltage (e.g., 0V to 0.3V) transistors, which tend to leak at fast process corners and hot temperatures, so those low threshold voltage transistors are not suitable for low voltage applications as described herein.

The body bias circuit 606 includes a current source 619 to generate a bias current, shown as IB. The bias current IB is mirrored through a current mirror 620 network to NFETs M25 and M26. In an example, M26 is implemented as a low threshold voltage MOSFET (e.g., having a threshold voltage of 0V-0.3V). The voltage at the gate of M25 is equal to the gate-to-source voltage of M25 (VGS), thereby causing the current through the divider network of resistors R1 and R2 (which is the same as current through M26) to equal the VGS of M25 divided by R1+R2. The resulting NFET bias BN is generated at an output of the divider network of R1 and R2, based on the relative resistance of R1 and R2 in the resistive network of R1 and R2. A capacitor is coupled between the intermediate node between R1 and R2 to generate the DC bias voltage BN for forward body biasing NFETs in the clock driver circuit 604.

Similarly, the bias current IB is mirrored to a bias generator circuit through current mirror network 622 to provide corresponding current through PFETs M27 and M28. PFET M28 is coupled in series with a divider network of resistors R3 and R4, coupled between the source of M28 and VDD. An output node of the divider network is coupled to VDD through a capacitor C12 to provide a respective PFET body bias signal BP. The voltage across the resistive network R3 and R4 corresponds to the source-to-gate voltage of M27, so the current through resistive network is equal to VSG of M27 divided by R3+R4.

As described above, the bias signals BN and BP provide forward body biasing of the NFETs and PFETs, respectively, of the clock driver circuit 604. In the example of FIG. 6, the clock driver circuits 616 and 618 include respective arrangements of one or more PFET and NFET pairs of transistors coupled between VDD and an electrical ground terminal. For example, respective half bridges of driver 616 include a PFET M29 having: a source coupled to VDD; and a drain coupled to the drain of a NFET M30 whose source coupled to the ground terminal. The gates of M29 and M30 are coupled to an output of the clock generator 602. Driver circuits 616 and 618 can include any number of half bridges. A common drain of M29 and M30 is coupled to an output of the driver 616, which provides the CK drive signal.

As a further example, the driver circuit 618 includes one or more half bridges. Each half bridge includes a PFET M31 whose source is coupled to VDD and whose drain is coupled to the drain of NFET M32 whose source is coupled to the ground terminal. The gates of M31 and M32 are coupled together and to another output of the clock generator and are configured to receive the other clock signal, which is non-overlapping with the clock signal at the gates M29 and M30. A common drain of M29 and M30 is coupled to an output of the driver 618, which provides the CKB drive signal as described herein.

Figure 7:
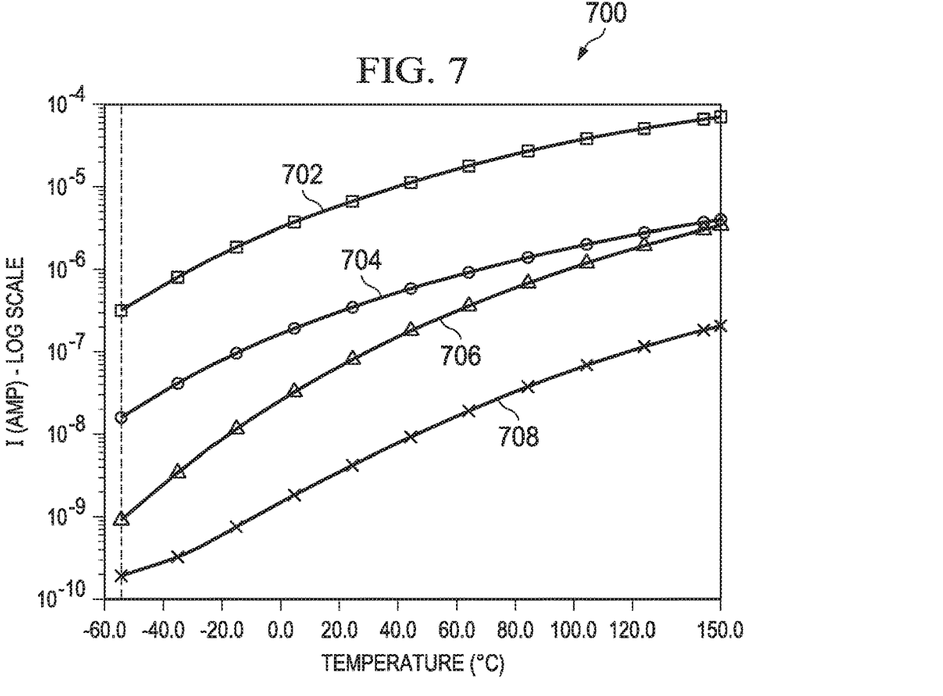
FIG. 7 is a graph of an example current versus temperature, showing leakage current with low Vth transistors and with normal Vth transistors with body biasing in the clock driver network across process corners.

FIG. 7 is a graph 700 of current versus temperature, showing leakage current across process corners for different clock driver circuit designs. The graph shows plots 702 and 704 of leakage current for a clock driver implementing low threshold voltage transistors at strong process corners and for a body-biased driver implementing normal threshold voltage transistors at strong process corners. Also, the graph shows plots 706 and 708 for a clock driver implementing low threshold voltage transistors at weak process corners and for a clock driver implementing normal threshold voltage transistors at weak process corners. The graph thus shows a significant leakage reduction for body-biased normal-threshold voltage transistors.

Figure 8:
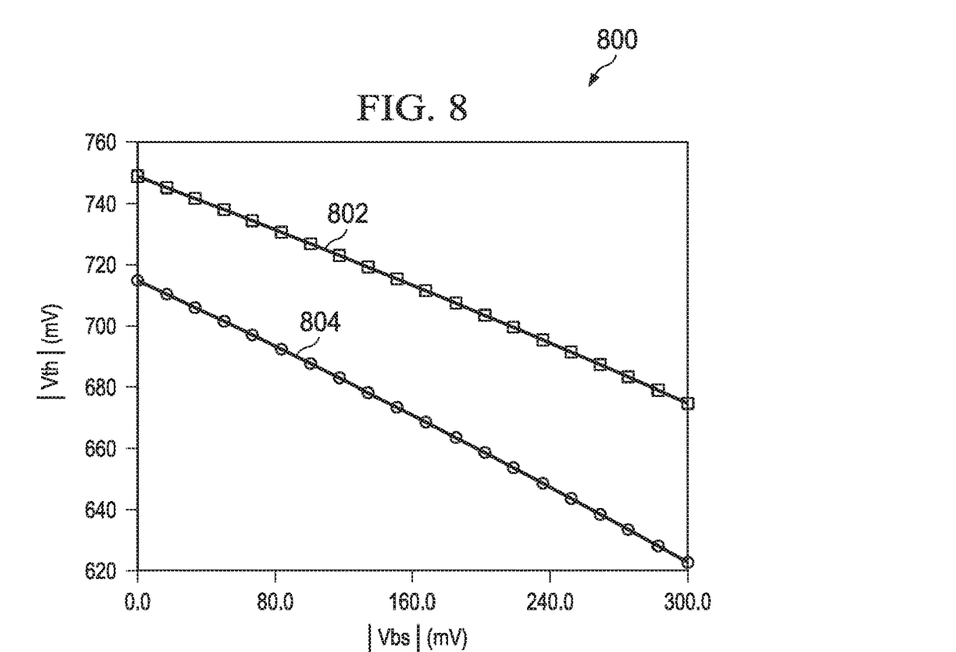
FIG. 8 is a graph of an example threshold voltage variation with respect to bulk-to-source voltage of normal Vth transistors.

FIG. 8 is a graph 800 of threshold voltage variation with respect to bulk-to-source voltage. The graph 800 includes plots 802 and 804 of NFET and PFET threshold voltages, respectively. As described herein, the threshold voltages are decreased by forward body biasing (e.g., by body bias circuit 152, 606).

Figure 9:
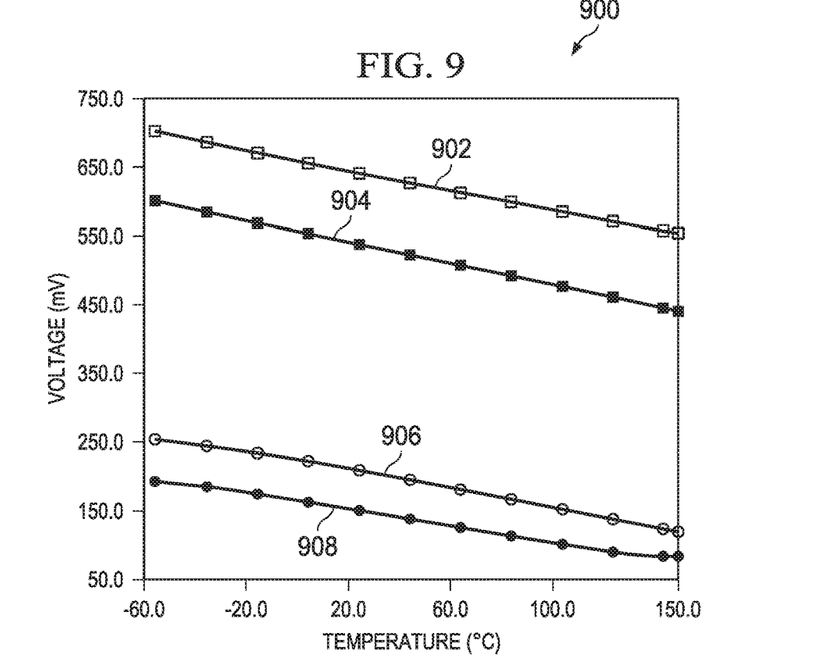
FIG. 9 is a graph of an example voltage versus temperature, showing bias voltage relative to threshold voltage for NFETs.

FIG. 9 is a graph 900 of voltage versus temperature, showing bias voltage relative to threshold voltage for NFETs. For example, a plot 902 shows threshold voltage for high threshold voltage NFETs at weak process corners, and a plot 904 shows threshold voltage for high threshold voltage NFETs at strong process corners. The graph 900 also includes plots 906 and 908 of NFET bias voltage BN at strong and weak process corners, respectively. The graph thus shows that BN voltage tracks variations in the threshold voltage of body biased normal threshold voltage NFETs in clock driver circuitry, as described herein.

Figure 10:
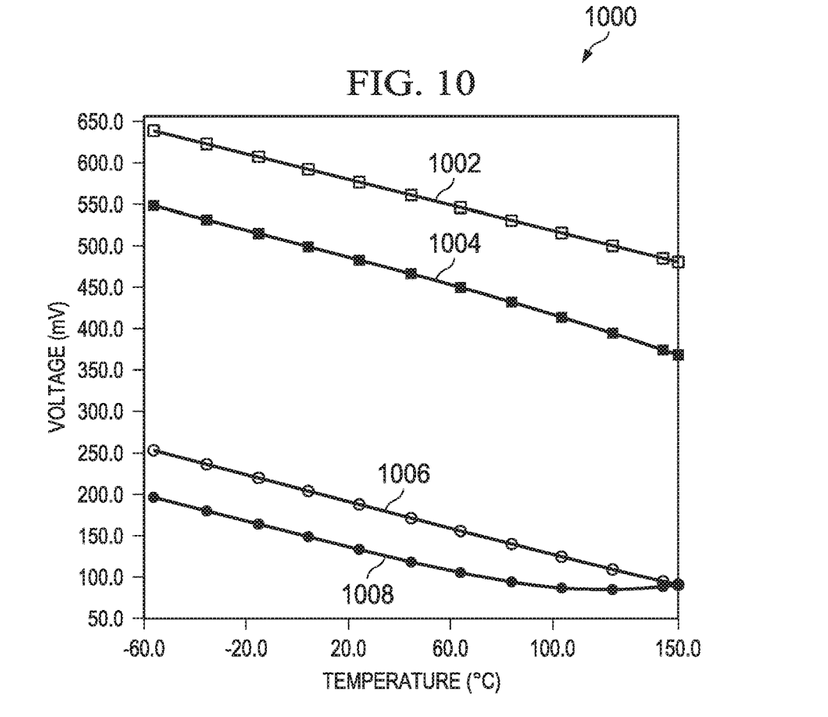
FIG. 10 is a graph of an example voltage versus temperature, showing bias voltage relative to threshold voltage for PFETs.

FIG. 10 is a graph 1000 of voltage versus temperature, showing bias voltage relative to threshold voltage for PFETs. For example, a plot 1002 shows threshold voltage for high threshold voltage PFETs at weak process corners, and a plot 1004 shows threshold voltage for high threshold voltage PFETs at strong process corners. The graph 1000 also includes plots 1006 and 1008 of PFET bias voltage BP at strong and weak process corners, respectively. The graph 1000 thus shows that the BP voltage tracks variations in the threshold voltage of body biased normal threshold voltage PFETs in clock driver circuitry, as described herein.

Figure 11:
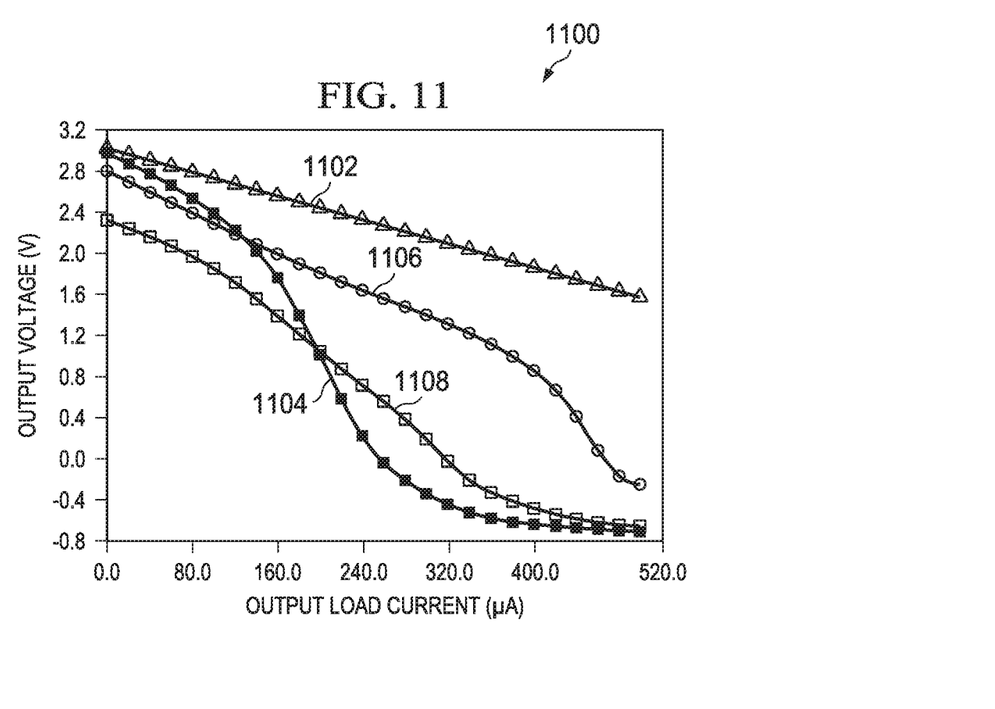
FIG. 11 is a graph of an example output voltage versus output load current for different charge pump designs.

FIG. 11 is a graph 1100 comparing output voltage versus output load current for different charge pump designs. In the example of FIG. 11, the graph 1100 includes a plot 1102 for the output voltage as a function of output load current for a charge pump circuit implemented according to this description (e.g., charge pump circuit 101, 200). The other plots 1104, 1106 and 1108 depict output voltage versus output load current for a latched charge pump design, a bootstrap charge pump design and an auxiliary switched charge pump design. The charge pump design described herein thus exhibits less output voltage variation, relative to increases in output load current when compared to other charge pump designs.

Figure 12:
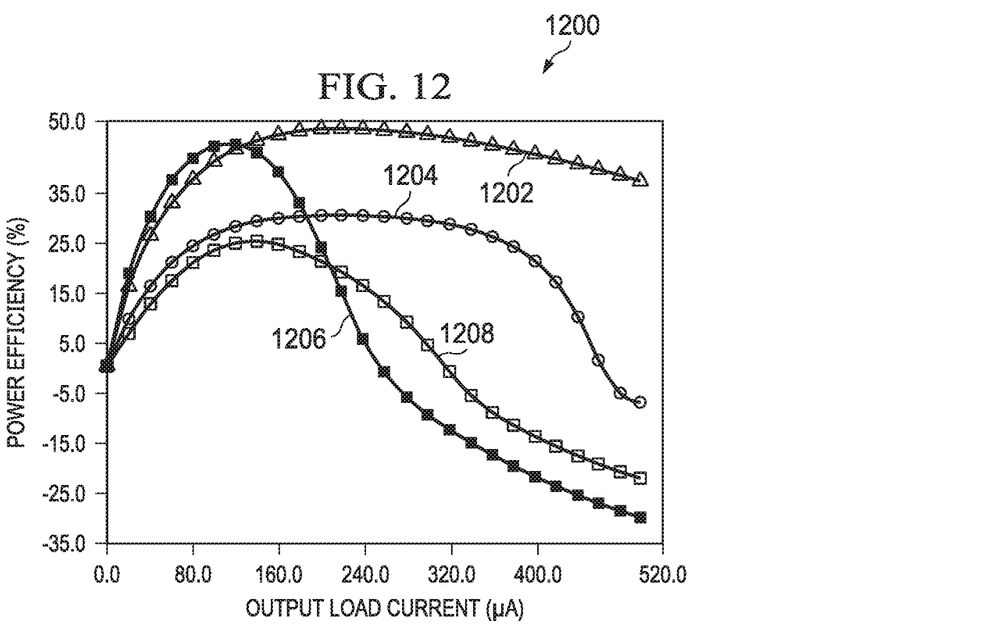
FIG. 12 is a graph of an example comparing power efficiency versus output load current for different charge pump designs.

FIG. 12 is a graph 1200 comparing power efficiency versus output load current for different charge pump designs. In the example of FIG. 12, the graph 1200 includes a plot 1202 for the power efficiency as a function of output load current for a charge pump circuit implemented according to this description (e.g., charge pump circuit 101, 200). The other plots 1204, 1206 and 1208 depict output voltage versus output load current for other charge pump designs, respectively, a bootstrap charge pump design, a latched charge pump design and an auxiliary switched charge pump design. The charge pump design described herein thus exhibits increased power efficiency, relative to increases in output load current over other charge pump designs.

Figure 13:
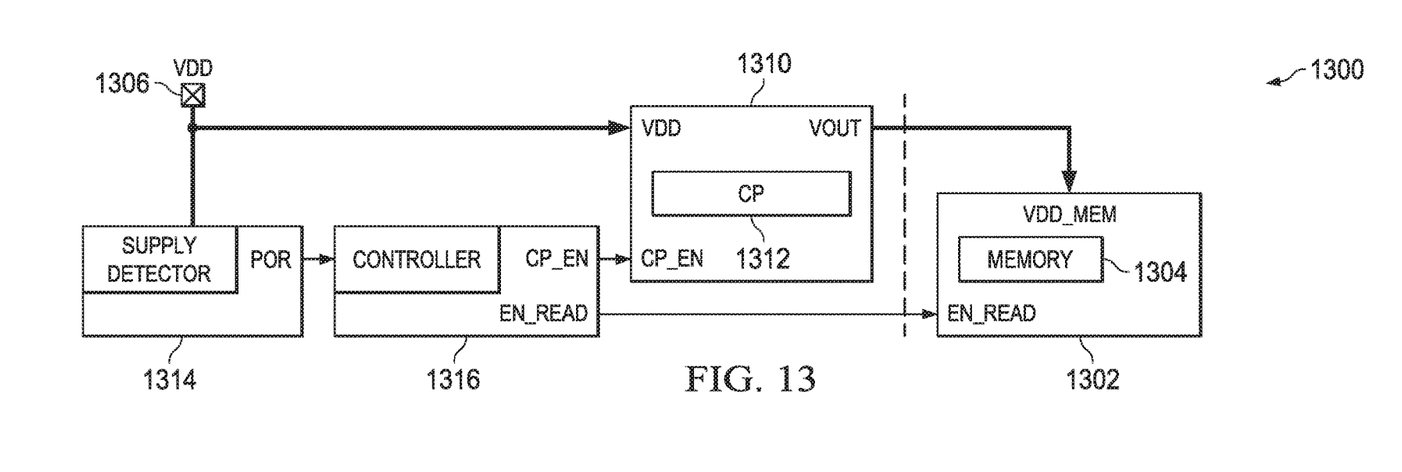
FIG. 13 is a block diagram of an example auxiliary power supply system for a memory device.

FIG. 13 is a block diagram of an auxiliary power supply system 1300 for a memory device 1302. For example, the memory device 1302 includes non-volatile or other memory structure 1304 (e.g., electrically erasable programmable read only memory (EEPROM)). In an example, the system 1300 and memory device 1302 are implemented as an integrated system on chip (SoC), which uses a common supply voltage VDD from a terminal 1306. For example, the supply voltage VDD is generated by a voltage regulator (not shown) and requires time to reach its steady state voltage level. The voltage regulator may be implemented on the SoC along with the system 1300 and memory 1302. Or, in another example, the regulator may be external to the SoC.

The system includes a charge pump system 1310 having a voltage input and a voltage output. The voltage input is coupled to the voltage supply terminal 1306, and the output is coupled to a voltage input of the memory device 1302. The charge pump system 1310 includes charge pump circuitry 1312. For example, the charge pump circuitry 1312 may be implemented by any of the charge circuits described herein (e.g., circuit 101, 200), and the charge pump circuitry is driven by a clock driver circuit (e.g., circuit 150, 604) coupled to and forward biased by body bias circuit (e.g., circuit 152, 606).

As a further example, a supply detector 1314 has an input coupled to the voltage supply terminal 1306. The supply detector 1314 has an output coupled to a controller (e.g., a digital controller) 1316. The supply detector 1314 is configured to: detect whether a supply voltage is connected at 1306; and provide a power on reset (POR) signal responsive to detecting a supply voltage at 1306 (e.g., that exceeds voltage threshold). The controller 1316 has a charge pump enable output coupled to an enable input of the pump system 1310. The controller also has an enable read output coupled to an enable read input of the memory device 1302. The controller 1316 thus is configured to control (e.g., selectively enable and disable) the charge pump system 1310 to turn on responsive to the POR signal. The controller 1316 is also configured to activate the memory device 1302 to perform a read operation responsive to the POR signal. In this way, the charge pump circuitry 1312 of the system 1310 operates as an auxiliary supply configured to generate an increased supply voltage (which is greater than the voltage at 1316) to the voltage input of the memory device 1302 during start up. This enables the memory device 1302 to read and load contents from the memory into respective registers of the memory device, while lower than a minimum operating supply voltage exists at 1306. As a result, the startup time of the memory device 1302 can be decreased when compared to other approaches.

Figure 14:
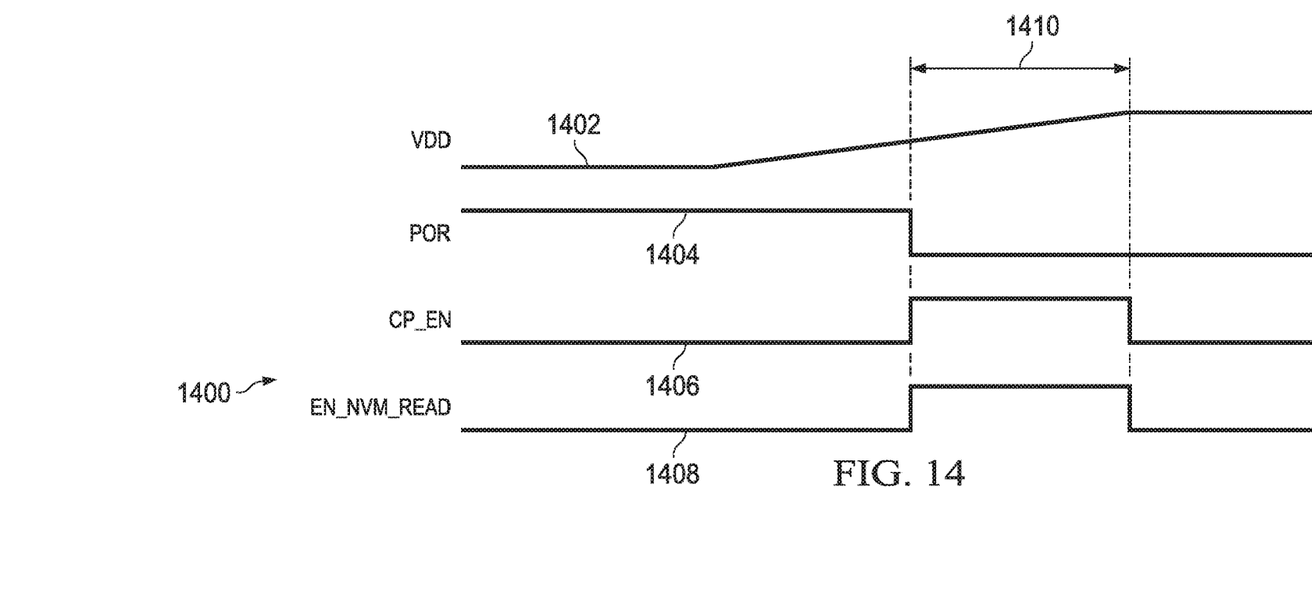
FIG. 14 is a signal diagram of signals in the system of FIG. 13.

FIG. 14 is a signal diagram 1400 of signals 1402, 1404, 1406 and 1408 in the system 1300 of FIG. 13. For example, the signal 1402 represents the signal VDD at 1306. The signal 1404 represents the signal at the POR output of the detector. The signal 1406 represents the signal at the charge pump enable output (CP_EN) of the controller 1316. The signal 1408 represents the signal at the read enable output (EN_READ) of the controller 1316. The time interval when the charge pump enable signal is asserted, shown at 1410, represents an operating region in which the charge pump circuitry is adapted to generate the increased voltage at the VOUT output, which is delivered to the voltage input of the memory device 1302.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action: in a first example, device A is coupled to device B; or in a second example, device A is coupled to device B through intervening component C if intervening component C does not substantially alter the functional relationship between device A and device B, so device B is controlled by device A via the control signal generated by device A.

In this description, the recitation "based on" means "based at least in part on." Therefore, if X is based on Y, then X may be a function of Y and any number of other factors.

What is claimed is:

1. A circuit comprising:
a charge pump circuit including an input charge pump stage and an output charge pump stage, each having a respective voltage input, a respective voltage output, a respective first clock input and a respective second clock input, in which the voltage input of the input charge pump stage is coupled to a voltage supply terminal, and the voltage output of the output charge pump stage is coupled to an output of the charge pump circuit;
a clock driver circuit having a first clock output, a second clock output, a first bias input and a second bias input, the first clock output coupled to the first clock inputs, and the second clock output coupled to the second clock inputs;
a body bias circuit having first and second bias outputs, the first bias output coupled to the first bias input, and the second bias output coupled to the second bias input;
a first n-type field effect transistor (NFET) charge transfer switch coupled between the voltage input of the input charge pump stage and the voltage output of the input charge pump stage, the first NFET charge transfer switch having a first gate configured to receive a first gate-boosted signal to turn on the first NFET charge transfer switch responsive to a first clock signal at the first clock input of the input charge pump stage; and
a second NFET charge transfer switch coupled between the voltage input of the output charge pump stage and the voltage output of the output charge pump stage, the second NFET charge transfer switch having a second gate configured to receive a second gate-boosted signal to turn on the second NFET charge transfer switch responsive to a second clock signal at the second clock input of the output charge pump stage.

2. The circuit of claim 1, wherein the circuit is an auxiliary power supply for a system on chip (SoC), and the SoC comprises a memory device having a power supply input coupled to the output of the charge pump circuit.

3. A circuit comprising:
a charge pump circuit including an input charge pump stage and an output charge pump stage, each having a respective voltage input, a respective voltage output, a respective first clock input and a respective second clock input, in which the voltage input of the input charge pump stage is coupled to a voltage supply terminal, and the voltage output of the output charge pump stage is coupled to an output of the charge pump circuit;
a clock driver circuit having a first clock output, a second clock output, a first bias input and a second bias input, the first clock output coupled to the first clock inputs, and the second clock output coupled to the second clock inputs, in which the clock driver circuit comprises:
a first driver including first n-type field effect transistors (NFETs) and first p-type field effect transistors (PFETs) configured to provide a first clock signal; and
a second driver including second NFETs and second PFETs configured to provide a second clock signal that is non-overlapping with the first clock signal; and a body bias circuit having first and second bias outputs, the first bias output coupled to the first bias input, and the second bias output coupled to the second bias input.

4. The circuit of claim 3, wherein:
the first NFETs and the second NFETs include the first bias input; and
the first PFETs and the second PFETs include the second bias input.

5. The circuit of claim 4, wherein the body bias circuit is configured to provide: an NFET forward body bias at the first bias output; and a PFET forward body bias at the second bias output.

6. The circuit of claim 5, wherein the body bias circuit comprises:
an NFET;
a first divider circuit coupled between a gate of the NFET and a ground terminal, the first divider circuit configured to provide the NFET forward body bias at an output thereof based on a gate-to-source voltage of the NFET;
a PFET; and
a second divider circuit coupled between a gate of the PFET and the voltage supply terminal, the second divider circuit configured to provide the PFET forward body bias at an output thereof based on a gate-to-source voltage of the PFET.

7. A device comprising:
an input charge pump stage having a voltage input and first and second voltage outputs, in which the voltage input is coupled to a voltage supply terminal, and the input charge pump stage is configured to supply a first pump voltage to the first voltage output and a second pump voltage to the second voltage output responsive to first and second clock signals;
an intermediate charge pump stage between the input charge pump stage and the output charge pump stage, the intermediate charge pump stage having first and second voltage inputs and first and second voltage outputs;
an output charge pump stage having first and second voltage inputs and a voltage output, in which the first voltage input is coupled to the first voltage output of the intermediate charge pump stage, the second voltage input is coupled to the second voltage output of the intermediate charge pump stage, and the output charge pump stage is configured to provide an output voltage at the voltage output responsive to the first and second clock signals;
a clock driver circuit configured to provide the first and second clock signals, the clock driver circuit comprising transistors;
a body bias circuit configured to supply forward body bias signals to the transistors of the clock driver circuit;
a first n-type field effect transistor (NFET) charge transfer switch coupled between the first voltage input of the intermediate charge pump stage and the first voltage output of the intermediate charge pump stage, the first NFET charge transfer switch having a first gate configured to receive a first gate-boosted signal to turn on the first NFET charge transfer switch responsive to the first clock signal; and
a second NFET charge transfer switch coupled between the second voltage input of the intermediate charge pump stage and the second voltage output of the intermediate charge pump stage, the second NFET charge transfer switch having a second gate configured to receive a second gate-boosted signal to turn on the second NFET charge transfer switch responsive to the second clock signal.

8. The device of claim 7, wherein the intermediate charge pump stage is a first intermediate charge pump stage, the device further comprises a second intermediate charge pump stage coupled between the input charge pump stage and the first intermediate charge pump stage, the first and second voltage inputs of the first intermediate charge pump stage are coupled to respective voltage outputs of the second intermediate charge pump stage, and the first intermediate charge pump stage is configured to supply first and second intermediate pump voltages at the first and second voltage outputs thereof, respectively, responsive to the first and second clock signals.

9. The device of claim 7, wherein the device is an auxiliary power supply for a system on chip (SoC), and the SoC comprises a memory device having a power supply input coupled to the voltage output of the output charge pump stage.

10. A device comprising:
an input charge pump stage having a voltage input and first and second voltage outputs, in which the voltage input is coupled to a voltage supply terminal, and the input charge pump stage is configured to supply a first pump voltage to the first voltage output and a second pump voltage to the second voltage output responsive to first and second clock signals;
an intermediate charge pump stage between the input charge pump stage and the output charge pump stage, the intermediate charge pump stage having first and second voltage inputs and first and second voltage outputs;
an output charge pump stage having first and second voltage inputs and a voltage output, in which the first voltage input is coupled to the first voltage output of the intermediate charge pump stage, the second voltage input is coupled to the second voltage output of the intermediate charge pump stage, and the output charge pump stage is configured to provide an output voltage at the voltage output responsive to the first and second clock signals;
a clock driver circuit configured to provide the first and second clock signals, the clock driver circuit comprising:
transistors;
a first driver including first n-type field effect transistors (NFETs) and first p-type field effect transistors (PFETs) configured to provide the first clock signal; and
a second driver including second NFETs and second PFETs configured to provide the second clock signal; and
a body bias circuit configured to provide: an NFET forward body bias to forward body bias the first NFETs and the second NFETs; and a PFET forward body bias to forward body bias the first PFETs and the second PFETs;
in which the body bias circuit comprises:
a first NFET;
a first divider circuit coupled between a gate of the first NFET and a ground terminal, the first divider circuit configured to provide the NFET forward body bias based on a gate-to-source voltage of the first NFET;
a first PFET; and
a second divider circuit coupled between a gate of the first PFET and the voltage supply terminal, the second divider circuit configured to provide the PFET forward body bias based on a gate-to-source voltage of the first PFET.

11. A system comprising:
an auxiliary power supply comprising:
a clock driver circuit configured to provide non-overlapping first and second clock signals, the clock driver circuit including transistors;
a body bias circuit configured to supply a forward body bias signal to the transistors; and
a charge pump circuit comprising charge pump stages connected in parallel, in which the charge pump stages include an input charge pump stage, an output charge pump stage and an intermediate charge pump stage between the input charge pump stage and the output charge pump stage, and the input charge pump stage is configured to supply first and second pump voltages based on a voltage at a voltage supply terminal and the first and second clock signals, and the output charge pump stage is configured to provide an output voltage at an output of the charge pump circuit based on a voltage at the intermediate charge pump stage and the first and second clock signals; and
a device coupled to the output of the charge pump circuit.

12. The system of claim 11, further comprising a controller coupled to the charge pump circuit and the device, the controller configured to enable the charge pump circuit and the device responsive to detecting the voltage at the voltage supply terminal.

13. The system of claim 11, wherein the device comprises a memory device.

* * * * *